United States Patent
Shutoh et al.

(10) Patent No.: US 7,663,054 B2
(45) Date of Patent: *Feb. 16, 2010

(54) THERMOELECTRIC MATERIAL AND THERMOELECTRIC MODULE USING THE THERMOELECTRIC MATERIAL

(75) Inventors: Naoki Shutoh, Yokohama (JP); Shinya Sakurada, Tokyo (JP); Naruhito Kondo, Kawasaki (JP); Osamu Tsuneoka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 802 days.

This patent is subject to a terminal disclaimer.

(21) Appl. No.: 10/958,376

(22) Filed: Oct. 6, 2004

(65) Prior Publication Data

US 2005/0139251 A1 Jun. 30, 2005

(30) Foreign Application Priority Data

Oct. 7, 2003 (JP) ............................. 2003-348400

(51) Int. Cl.
 *H01L 35/14* (2006.01)
 *H01L 35/20* (2006.01)
 *H01L 35/12* (2006.01)
(52) U.S. Cl. ................. 136/239; 136/236.1; 136/240
(58) Field of Classification Search ............... 139/239, 139/236.1, 240
 See application file for complete search history.

(56) References Cited

U.S. PATENT DOCUMENTS

| 2003/0084935 A1* | 5/2003 | Bell ............................ 136/200 |
| 2003/0154725 A1* | 8/2003 | McGrew ....................... 62/3.7 |
| 2004/0112418 A1* | 6/2004 | Yang et al. .................. 136/239 |
| 2005/0172994 A1* | 8/2005 | Shutoh et al. ............... 136/239 |

OTHER PUBLICATIONS

Poon et al. "Bandgap Features and Thermoelectric Properties of Ti-Based Half-Heusler Alloys" IEEE, 18th International Conference on Thermoelectrics, 1999, pp. 45-51.*
Hohl et al. "Efficient Dopants for ZrNiSn-based thermoelectric materials" J.Phys.: Condens. Matter, 11, 1999, pp. 1697-1709.*
S. Sportouch, et al., "Thermoelectric Properties of Half-Heusler Phases: $ErNi_{1-x}Cu_xSb_1$ $YNi_{1-x}Cu_xSb$ and $Zr_xHf_yTi_zNiSn$" IEEE, $18^{th}$ International Conference on Thermoelectrics, 1999, pp. 344-347.
Y. Xia, et al., "Thermoelectric Properties of Semimetallic (Zr, Hf)CoSb Half-Heusler Phases", Journal of Applied Physics, vol. 88, No. 4, Aug. 15, 2000, pp. 1952-1955.

* cited by examiner

*Primary Examiner*—Nam X Nguyen
*Assistant Examiner*—Dustin Q Dam
(74) *Attorney, Agent, or Firm*—Oblon, Spivak, McClelland, Maier & Neustadt, L.L.P.

(57) ABSTRACT

Disclosed is a thermoelectric material comprising a main phase which is represented by the following composition formula and having an MgAgAs-type crystalline structure:

$$(T_{a1}Zr_{b1}Hf_{c1})_xCo_ySb_{100-x-y}$$

wherein $0<a1<1$, $0<b1<1$, $0<c1<1$, $a1+b1+c1=1$, $30 \leq x \leq 35$, and $30 \leq y \leq 35$.

19 Claims, 2 Drawing Sheets

THERMOELECTRIC MATERIAL AND THERMOELECTRIC MODULE USING THE THERMOELECTRIC MATERIAL

CROSS-REFERENCE TO RELATED APPLICATIONS

This application is based upon and claims the benefit of priority from prior Japanese Patent Application No. 2003-348400, filed Oct. 7, 2003, the entire contents of which are incorporated herein by reference.

BACKGROUND OF THE INVENTION

1. Field of the Invention

This invention relates to a thermoelectric material and to a thermoelectric module using this thermoelectric material. In particular, this invention relates to a thermoelectric material comprising, as a main phase, a half-Heuslar compound having an MgAgAs-type crystalline structure and to a thermoelectric module using this thermoelectric material.

2. Description of the Related Art

In recent years, due to ever increasing consciousness about the global environment, there is increasing interest in a thermoelectric module where the Peltier effect is taken advantage of, such as a flonless refrigerating machine. Likewise, with a view to minimize the discharge of carbon dioxide, there is increasing interest in a thermoelectric module where the Seebeck effect is taken advantage of for providing a power generating system using waste heat energy.

These thermoelectric modules where the Peltier effect or Seebeck effect is taken advantage of are generally created using p-type elements comprising a p-type thermoelectric material and n-type elements comprising an n-type thermoelectric material, these p- and n-type elements being alternately connected with each other in series. Most thermoelectric materials utilized near room temperature are formed of a single crystal or polycrystalline Bi—Te-based material, since the single crystal or polycrystalline Bi—Te-based material is high in conversion efficiency. And thermoelectric materials utilized in above room temperature are usually formed of a single crystal or polycrystalline Pb—Te-based material, since the single crystal or polycrystalline Pb—Te-based material is also high in conversion efficiency.

However, selenium (Se) and lead (Pb) to be employed as a dopant in the Bi—Te-based crystal are noxious and harmful to the human body and also undesirable from a global environmental viewpoint. Therefore, a harmless material which can be employed in place of the Bi—Te-based or Pb—Te-based materials is now being sought.

The half-Heusler compounds can be represented by a chemical formula ABX and is an intermetallic compound having an MgAgAs type cubic crystal structure wherein the B atom is inserted into the NaCl type crystal lattice of AX. Compounds having such a structure are capable of exhibiting a high Seebeck coefficient at room temperature. For example, it is reported that TiNiSn has a Seebeck coefficient of −142 μV/K; ZrNiSn, a Seebeck coefficient of −176 μV/K, and HfNiSn, has a Seebeck coefficient of −124 μV/K.

The figure of merit Z of the thermoelectric material can be represented by the following expression (1):

$$Z = \alpha^2 \sigma / \kappa \tag{1}$$

wherein α is the Seebeck coefficient of the thermoelectric material; σ is the conductivity; and κ is the thermal conductivity of the thermoelectric material. The inverse number of the conductivity σ can be represented by the electric resistivity ρ.

The figure of merit Z has a dimension which is the inverse of temperature. When this figure of merit Z is multiplied by the absolute temperature, it gives a dimensionless value ZT. This dimensionless value ZT is called the dimensionless figure-of-merit and is correlated to the thermoelectric conversion efficiency of the thermoelectric material, so that the greater ZT becomes in a thermoelectric material, the greater the thermoelectric conversion efficiency of the thermoelectric material becomes. In other word, provided that a thermoelectric material is less capable of transmitting heat, better at transmitting electricity, and greater in thermoelectric power generating capacity, the thermoelectric material becomes greater in thermoelectric conversion efficiency. For example, the Bi—Te-based material which are the highest dimensionless figure-of-merit among the materials known to date is capable of exhibiting a dimensionless figure-of-merit of about 1.0 at 300K.

Although the aforementioned half-Heuslar compound ZrNiSn has a Seebeck coefficient as high as −176 μV/K at room temperature, its resistivity at room temperature is as high as 11 mΩcm and its thermal conductivity is as high as 8.8 W/mK. Accordingly, it is reported that the dimensionless figure-of-merit ZT of the compound ZrNiSn is as small as 0.010 and the thermoelectric conversion efficiency is also small. In the cases of the compounds TiNiSn and HfNiSn, the thermoelectric conversion efficiency is much smaller, i.e., about 0.007 in the case of TiNiSn and 0.005 in the case of HfNiSn.

There is also reported another half-Heuslar compound which includes all of Ti, Zr and Hf and can be represented by the formula of $Ti_xZr_yHf_zNiSn$ (x=0.5-0.8; y or z=0.1-0.4).

This half-Heuslar compound represented by $Ti_xZr_yHf_zNiSn$ (x=0.5-0.8; y or z=0.1-0.4) is reported to exhibit at room temperature a Seebeck coefficient of −253 μV/K, an resistivity of 6.9 mΩcm and a thermal conductivity of 5.7 W/mK when x, y, and z is 0.5, 0.2 and 0.3, respectively, indicating that since this half-Heuslar compound includes all of Ti, Zr and Hf, its thermal conductivity can be reduced compared with the aforementioned ternary compounds.

However, even with this half-Heuslar compound represented by $Ti_xZr_yHf_zNiSn$ (x=0.5-0.8; y or z=0.1-0.4), the dimensionless figure-of-merit at room temperature is as small as 0.05 or not as high compared with the aforementioned Bi—Te-based material.

BRIEF SUMMARY OF THE INVENTION

According to one aspect of the present invention, there is provided a thermoelectric material comprising a main phase which is represented by the following composition formula and having an MgAgAs-type crystalline structure:

$(T_{a1}Zr_{b1}Hf_{c1})_xCo_ySb_{100-x-y}$ wherein 0<a1<1, 0<b1<1, 0<c1<1, a1+B1+c1=1, 30≦X≦35, and 30≦y≦35.

According to another aspect of the present invention, there is also provided a thermoelectric module comprising p-type elements comprising a p-type thermoelectric material and n-type elements comprising an n-type thermoelectric material, these p-type and n-type elements being alternately connected with each other in series, and at least one of the p-type thermoelectric material and n-type thermoelectric material comprising a main phase which is represented by the following composition formula and having an MgAgAs-type crystalline structure:

$$(T_{a1}Zr_{b1}Hf_{c1})_xCo_ySb_{100-x-y}$$

wherein $0<a1<1$, $0<b1<1$, $0<c1<1$, $a1+B1+c1=1$, $30 \leq X \leq 35$, and $30 \leq y \leq 35$.

DETAILED DESCRIPTION OF THE INVENTION

Next, the present invention will be explained with reference to specific embodiments.

Figure 1:
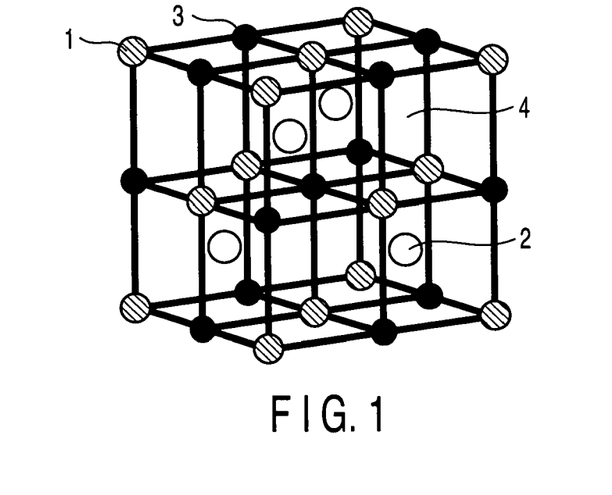
FIG. 1 is a diagram schematically illustrating the structure of half-Heuslar compound "ABX"

FIG. 1 illustrates the crystalline structure of half-Heuslar compound "ABX". In FIG. 1, the reference numerals 1, 2 and 3 represent "A" element, "B" element and "X" element, respectively, and the reference numeral 4 represents vacancy. In the case of the half-Heuslar compound represented by (Ti,Zr,Hf)CoSb, "A" element is constituted by Ti, Zr and Hf, "B" element is constituted by Co, and "X" element is constituted by Sb.

Conventionally, this half-Heuslar compound represented by (Ti,Zr,Hf)NiSn is accompanied with a problem that it is impossible to obtain a sufficient figure of merit if it is to be employed as a thermoelectric material. Under the circumstances, the present inventors have made extensive studies using various elements to find out the fact that when, as shown in FIG. 1, the elements of the "A" site is constituted by a ternary system consisting of Ti, Zr and Hf, the "B" site is constituted by Co, and the "X" site is constituted by Sb in the chemical formula of "ABX" representing the half-Heuslar compound, it is possible to increase the Seebeck coefficient and hence to enhance the figure of merit, thus accomplishing the present invention.

Accordingly, the thermoelectric material according to this embodiment is characterized in that it is represented by the following composition formula (1) and that it includes as a main phase an MgAgAs-type crystalline structure. It is assumed that when the "B" element is constituted by Co and the "X" element is constituted by Sb, the band structure of the resultant thermoelectric material changes, resulting in an increase of the Seebeck coefficient and therefore improvement of figure of merit. Thus, since this thermoelectric material which is represented by the following composition formula (1) is capable of generating a higher voltage even under the same condition in regard to temperature difference, it is possible to minimize the loss in a booster circuit.

$$(Ti_{a1}Zr_{b1}Hf_{c1})_xCo_ySb_{100-x-y} \qquad \text{composition formula (1)}$$

wherein $0<a1<1$, $0<b1<1$, $0<c1<1$, $a1+B1+c1=1$, $30 \leq X \leq 35$, and $30 \leq y \leq 35$.

In order to enable the "A" site to include all of Ti, Zr and Hf, the values of a1, b1 and c1 in the aforementioned composition formula (1) are required to be larger than zero. Accordingly, the values of a1, b1 and c1 can be defined as $0<a1<1$, $0<b1<1$, $0<c1<1$ and $a1+b1+c1=1$. In particular, if it is desired to minimize the thermal conductivity and to increase the Seebeck coefficient, the values of a1, b1 and c1 should be confined to $0.2<a1<0.8$, $0.2<b1<0.8$, $0.2<c1<0.8$ and $a1+b1+c1=1$.

Further, "x" and "y" in the aforementioned composition formula (1) should be confined to the ranges of: $30 \leq X \leq 35$ and $30 \leq y \leq 35$, respectively, thereby making it possible to enhance the volumetric occupation ratio of the phase having the MgAgAs-type crystalline structure and hence to obtain a higher Seebeck coefficient. More preferable ranges of "x" and "y" would be $33 \leq X \leq 34$ and $33 \leq y \leq 34$, respectively. When "x" and "y" are confined within the aforementioned ranges, it is possible to obtain a thermoelectric material exhibiting n-type thermoelectric conversion characteristics.

Part of Ti, Zr and Hf in the aforementioned composition formula (1) may be replaced by at least one element selected from the group consisting of V, Nb, Ta, Cr, Mo and W. These elements may be employed singly or in combination of two or more for replacing part of Ti, Zr and Hf. It is possible, through this substitution, to adjust the total number of valence electron in the MgAgAs phase constituting the main phase to increase the Seebeck coefficient and electric conductivity. However, the magnitude of this substitution should preferably be confined to not more than 30 atom. % of the total quantity of Ti, Zr and Hf. When this substitution is confined to not more than 30 atom. % of the total quantity of Ti, Zr and Hf, the volumetric occupation ratio of the phase having the MgAgAs-type crystalline structure can be increased, thus making it possible to enhance the Seebeck coefficient.

Further, part of Co in the aforementioned composition formula (1) may be replaced by at least one element selected from the group consisting of Ni, Pd and Pt. These elements may be employed singly or in combination of two or more for replacing part of Co. It is possible, through this substitution, to adjust the total number of valence electron in the MgAgAs phase constituting the main phase to increase the Seebeck coefficient and electric conductivity. However, the magnitude of this substitution should preferably be confined to not more than 30 atom. % of Co in order to increase the volumetric occupation ratio of the phase having the MgAgAs-type crystalline structure so as to increase the Seebeck coefficient.

Furthermore, part of Sb in the aforementioned composition formula (1) may be replaced by at least one element selected from the group consisting of Bi, Se and Te. These elements may be employed singly or in combination of two or more for replacing part of Sb. It is possible, through this substitution, to adjust the total number of valence electron in the MgAgAs phase constituting the main phase to increase the Seebeck coefficient and electric conductivity. However, in view of noxiousness, harmfulness and material cost, it is especially preferable to employ Te for substituting part of Sb. The magnitude of this substitution should preferably be confined to not more than 30 atom. % of Sb. When this substitution is confined to not more than 30 atom. % of Sb, the volumetric occupation ratio of the phase having the MgAgAs-type crystalline structure can be increased, thus making it possible to enhance the Seebeck coefficient.

When part of Ti, Zr and Hf, part of Co or part of Sb in the aforementioned composition formula (1) is replaced as explained above, it is possible to obtain a thermoelectric material exhibiting n-type thermoelectric conversion characteristics. The reason for this can be attributed to the fact that since each of the aforementioned elements in the composition formula (1) is replaced by an element which is larger by one in number of outer shell valence electron, an n-type conductivity carrier generates. The aforementioned substitution of Ti, Zr and Hf, substitution of Co or substitution of Sb may not necessarily be performed singly, but may be performed through a suitable combination of these substitutions.

On the other hand, part of Ti, Zr and Hf in the aforementioned composition formula (1) may be replaced by at least one element selected from the group consisting of Sc, Y, Th, U and lanthanoids. By the term "lanthanoids", it is intended to include La, Ce, Pr, Nd, Pm, Sm, Eu, Gd, Tb, Dy, Ho, Er, Tm, Yb and Lu. These elements may be employed singly or in combination of two or more for replacing part of Ti, Zr and Hf. It is possible, through this substitution, to adjust the total number of valence electron in the MgAgAs phase constituting the main phase to increase the Seebeck coefficient and electric conductivity. However, the magnitude of this substitution should preferably be confined to not more than 30 atom. % of the total quantity of Ti, Zr and Hf. When this substitution is confined to not more than 30 atom. % of the total quantity of Ti, Zr and Hf, the volumetric occupation ratio of the phase having the MgAgAs-type crystalline structure can be increased, thus making it possible to enhance the Seebeck coefficient.

Further, part of Co in the aforementioned composition formula (1) may be replaced by at least one element selected from the group consisting of Fe, Ru and Os. These elements may be employed singly or in combination of two or more for replacing part of Co. It is possible, through this substitution, to adjust the total number of valence electron in the MgAgAs phase constituting the main phase to increase the Seebeck coefficient and electric conductivity. However, the magnitude of this substitution should preferably be confined to not more than 30 atom. % of Co in order to increase the volumetric occupation ratio of the phase having the MgAgAs-type crystalline structure so as to increase the Seebeck coefficient.

Furthermore, part of Sb in the aforementioned composition formula (1) may be replaced by at least one element selected from the group consisting of Pb, Ge and Sn. These elements may be employed singly or in combination of two or more for replacing part of Sb. It is possible, through this substitution, to adjust the total number of valence electron in the MgAgAs phase constituting the main phase to increase the Seebeck coefficient and electric conductivity. However, in view of noxiousness, harmfulness and material cost, it is especially preferable to employ Sn or Ge for substituting part of Sb. The magnitude of this substitution should preferably be confined to not more than 30 atom. % of Sb. When this substitution is confined to not more than 30 atom. % of Sb, the volumetric occupation ratio of the phase having the MgAgAs-type crystalline structure can be increased, thus making it possible to enhance the Seebeck coefficient.

When part of Ti, Zr and Hf, part of Co or part of Sb in the aforementioned composition formula (1) is replaced as explained above, it is possible to obtain a thermoelectric material exhibiting p-type thermoelectric conversion characteristics. The reason for this can be attributed to the fact that since each of the aforementioned elements in the composition formula (1) is replaced by an element which is smaller by one in number of outer shell valence electron, a p-type conductivity carrier generates. The aforementioned substitution of Ti, Zr and Hf, substitution of Co or substitution of Sb may not necessarily be performed singly, but may be performed through a suitable combination of these substitutions.

The thermoelectric material according to this embodiment can be manufactured by the following method, for instance.

First of all, an alloy containing predetermined elements each in a prescribed quantity is manufactured by arc melting or high-frequency melting. On the occasion of manufacturing the alloy, it is possible to employ a single-roll method, a double-roll method, a rotating disc method, a liquid quenching method such as a gas atomizing method, or a method utilizing a solid-phase reaction such as a mechanical alloying method. Among them, the liquid quenching method and the mechanical alloying method are advantageous in the respect that it is possible to enlarge the solid solution zones of elements inside the crystal phase and hence to refine the crystal phase constituting the alloy. As a result, it is possible to greatly lower the thermal conductivity of the thermoelectric material.

Alternatively, without subjecting raw metal powder to the aforementioned melting process, the raw metal powder may be subjected to hot press to manufacture an alloy.

The alloy manufactured in this manner may be further subjected to a heat treatment as required. It is possible, through this heat treatment, to turn the alloy into a single-phase and to control the crystalline particle diameter, thereby further enhancing the thermoelectric characteristics. The steps including the aforementioned melting step, liquid quenching step, mechanical alloying step and heat treatment should preferably be performed in an inert atmosphere such as Ar atmosphere in view of preventing the oxidation of the alloy.

Then, the alloy thus obtained is pulverized by using a ball mill, a Braun mill or a stamp mill to obtain alloy powder, which is then subjected to monolithic molding by sintering, hot press or SPS method. This monolithic molding should preferably be performed in an inert atmosphere such as Ar atmosphere to prevent the oxidation of the alloy. Subsequently, a molded body thus obtained is worked into a body of desired dimension, thereby obtaining a thermoelectric material according to the embodiment of the present invention. The configuration and dimension of the molded body may be optionally selected. For example, the thermoelectric material may be formed into a cylindrical body having an outer diameter ranging from 0.5 to 10 mm and a thickness ranging from 1 to 30 mm, or into a rectangular parallelepiped having a dimension of: (0.5-10 mm)×(0.5-10 mm)×(1-30 mm thick).

By using the thermoelectric materials obtained in the aforementioned manners, a thermoelectric module according to the embodiment of the present invention will be manufactured. One example of the construction of such a thermoelectric module is illustrated as a schematic cross-sectional view in FIG. 2.

Figure 2:
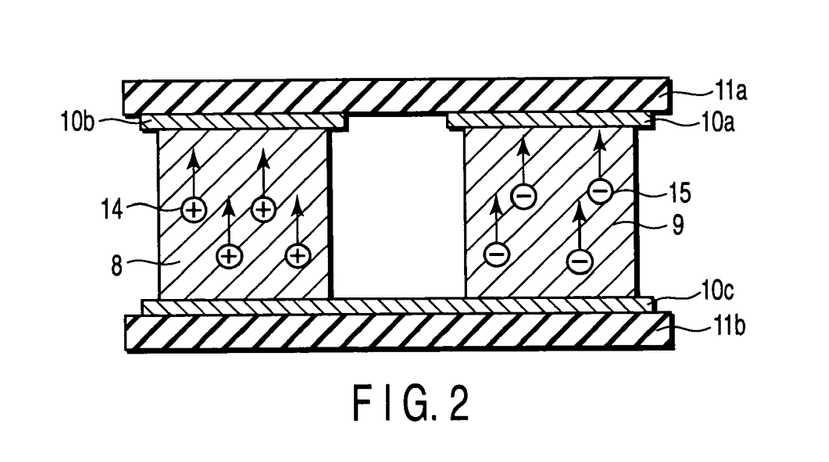
FIG. 2 is a diagram schematically illustrating a thermoelectric module according to one embodiment of the present invention.

In the thermoelectric module shown in FIG. 2, a thermoelectric material 9 formed of an n-type semiconductor according to the embodiment of the present invention and a thermoelectric material 8 formed of a p-type semiconductor according to the embodiment of the present invention are juxtaposed with each other. On the top surface of the n-type thermoelectric material 9, an electrode 10a is disposed. Likewise, on the bottom surface of the p-type thermoelectric material 8, an electrode 10b is disposed. The outer surfaces of these electrodes 10a and 10b are sustained by an upper insulating substrate 11a. The undersides of the n-type thermoelectric material 9 and the p-type thermoelectric material 8 are connected with an electrode 10c which is supported by an underside insulating substrate 11b.

When a difference in temperature generates between the upper insulating substrate 11a and the underside insulating substrate 11b so as to make the upper side lower in temperature and make the lower side higher in temperature, a hole 14 having a positive electric charge moves toward the lower temperature side (upper side) as far as the interior of the p-type thermoelectric material 8 is concerned, thereby making the electrode 10b higher in electric potential than the electrode 10c. On the other hand, as far as the interior of the n-type thermoelectric material 9 is concerned, an electron 15 having a negative electric charge moves toward the lower temperature side (upper side), thereby making the electrode 10c higher in electric potential than the electrode 10a.

As a result, a difference in electric potential generates between the electrode 10a and the electrode 10b. As shown in FIG. 2, when the upper side is made lower in temperature and the lower side is made higher in temperature, the electrode 10b becomes a positive electrode, and the electrode 10a becomes a negative electrode.

Figure 3:
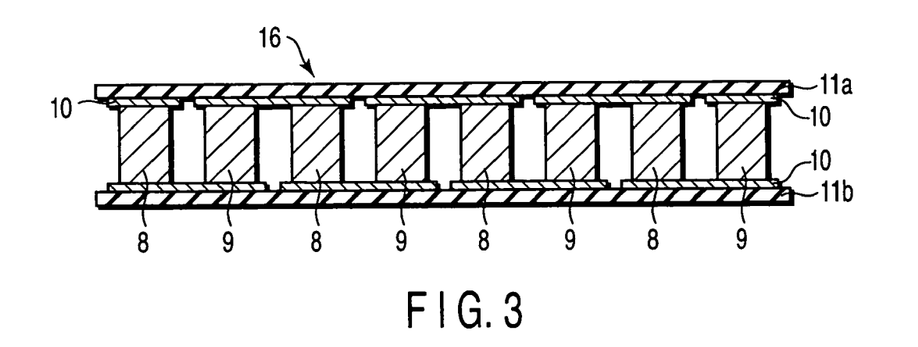
FIG. 3 is a diagram schematically illustrating a thermoelectric module according to another embodiment of the present invention.

As shown in FIG. 3, when a plurality of the p-type thermoelectric material 8 and a plurality of the n-type thermoelectric material 9 are alternately connected with each other in series, it is possible to obtain a higher voltage as compared with the structure shown in FIG. 2 and hence to secure a larger electric power.

Figure 4:
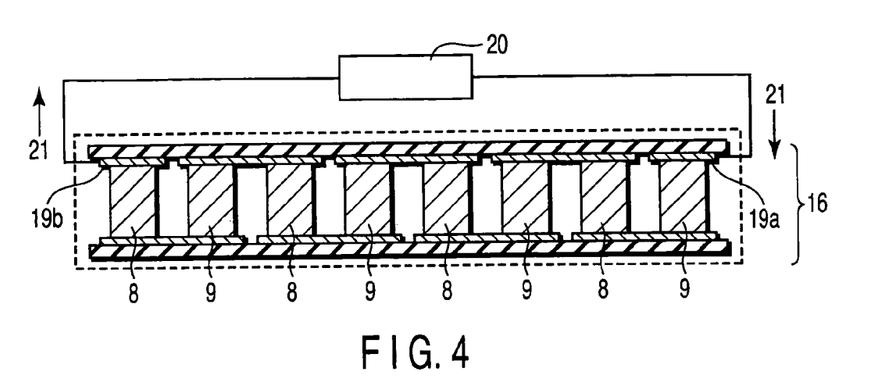
FIG. 4 is a diagram schematically illustrating a thermoelectric module according to a further embodiment of the present invention.

The thermoelectric module 16 described above is applicable to a thermal battery. One example of the structure of the thermal battery is shown in FIG. 4. As shown in FIG. 4, when the upper side of the thermoelectric module 16 is made lower in temperature and the lower side thereof is made higher in temperature, a potential difference generates at the terminal electrode 19 of the thermoelectric module 16. When the electrode 19a and the electrode 19b are respectively connected with a load 20, electric current 21 flows in the direction indicated by the arrow as shown in FIG. 4, thereby enabling the thermoelectric module 16 to function as a thermal battery.

Figure 5:
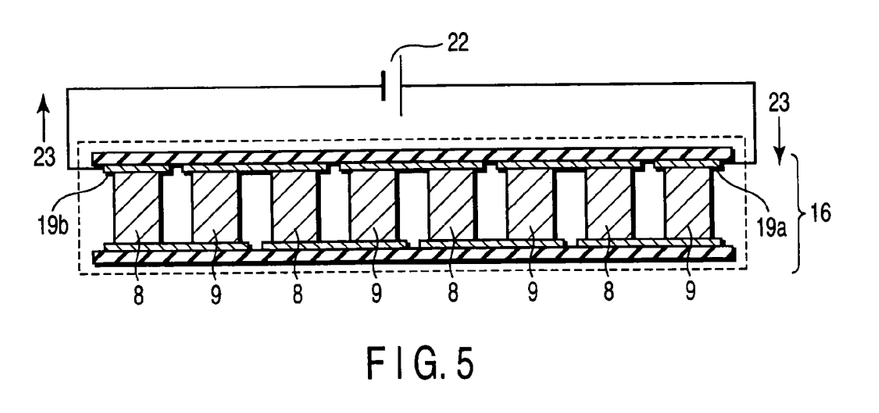
FIG. 5 is a diagram schematically illustrating a thermoelectric module according to a further embodiment of the present invention.

Alternatively, the thermoelectric module described above is applicable to a cooler. One example of the structure of the cooler is shown in FIG. 5. As shown in FIG. 5, when a DC current 23 flows in the direction indicated by the arrow as shown in FIG. 5 toward the terminal electrode 19 of the thermoelectric module 16 by using a DC power source 22, the upper side of the thermoelectric module 16 is made higher in temperature while the lower side thereof is made lower in temperature, thereby enabling the thermoelectric module to function as a cooler.

The thermoelectric material of embodiments of the present invention will be further explained in detail in reference to the following specific examples.

EXAMPLE 1

99.9% pure Ti, 99.9% pure Zr, 99.9% pure Hf, 99.99% pure Co and 99.99% pure Sb were prepared as raw materials, which were then weighed respectively to meet a composition formula of $(Ti_{0.3}Zr_{0.35}Hf_{0.35})CoSb$.

The raw materials weighed as described above were mixed together and placed in a water-cooled copper hearth which was disposed inside an arc furnace. Then, the interior of the hearth was evacuated to a vacuum degree of $2\times10^{-3}$ Pa. Subsequently, high-purity Ar gas 99.999% in purity was introduced into the hearth up to −0.04 MPa to form a reduced-pressure Ar atmosphere, in which the raw materials were subjected to arc-melting.

A metallic lump thus obtained was pulverized and then molded by using a mold having an inner diameter of 20 mm under a pressure of 50 MPa. The molded body thus obtained was placed inside a carbon mold having an inner diameter of 20 mm and was subjected to a pressure sintering for one hour in an Ar atmosphere and under the conditions of: 80 MPa and 1200° C., thereby obtaining a disc-like sintered body having a diameter of 20 mm.

It was confirmed, through the examination of this sintered body by powder X-ray diffractometry, that this sintered body comprises, as a main phase, an MgAgAs-type crystal structure.

It was also confirmed, through the analysis of the composition of this sintered body by ICP emission spectrometry, that this sintered body was substantially formed of the composition of raw materials that had been weighed.

The sintered body obtained in this manner was then evaluated with respect to thermoelectric characteristics according to the following methods.

(1) Electric Resistivity:

The sintered body was cut out into a piece having a dimension of: 2 mm×0.5 mm×18 mm, to which electrodes were attached to measure the electric resistivity of the piece by a DC four probe method.

(2) Seebeck Coefficient:

The sintered body was cut out into a piece having a dimension of: 4 mm×1 mm×0.5 mm, and a temperature difference of 2° C. was created between the opposite ends of the piece to measure the electromotive force thereof, thus determining the Seebeck coefficient thereof.

(3) Thermal Conductivity:

The sintered body was cut out into a piece having a dimension of: 10 mm(diameter)×2.0 mm(thickness), and the heat diffusivity thereof was measured by laser flash method. In separate from this measurement, the specific heat of the sintered body was determined by DSC measurement, and the density of the sintered body was determined by Archimedes' method, thereby calculating the thermal conductivity of the sintered body on the basis of these measurements.

By using the values obtained of the electric resistivity, the Seebeck coefficient and the thermal conductivity, the dimensionless figure of merit ZT was determined according to the aforementioned expression (1). The values of the electric resistivity, the Seebeck coefficient, the lattice thermal conductivity and the dimensionless figure of merit ZT all obtained at temperatures of 300K and 700K were as follows.

300K: Electric resistivity=$7.66\times10^{-3}$ Ωcm;
Seebeck coefficient=−281 µV/K;
Lattice thermal conductivity=3.51 W/mK;
ZT=0.08
700K: Electric resistivity=$2.86\times10^{-3}$ Ωcm;
Seebeck coefficient=−399 µV/K;
Lattice thermal conductivity=2.81 W/mK;
ZT=1.14

Figure 6:
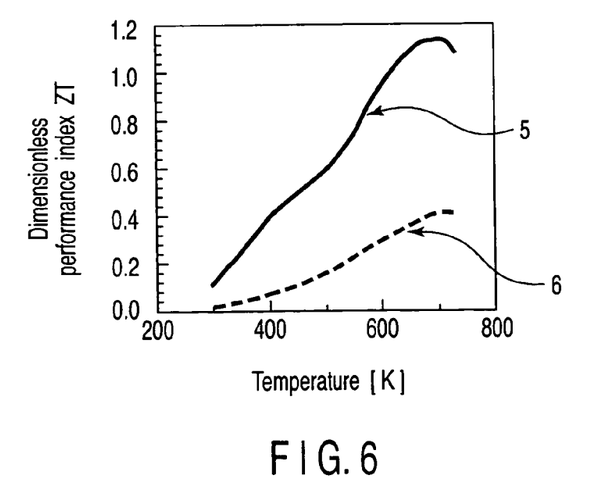
FIG. 6 is a graph illustrating the temperature dependency of dimensionless figure-of-merit of the thermoelectric material according to another embodiment of the present invention.

The temperature dependency of dimensionless figure of merit ZT of the thermoelectric material manufactured in (Example 1) is shown as a curve "5" in FIG. 6. As shown in FIG. 6, it is possible to obtain a dimensionless ZT of about 1.14 at maximum.

As already explained, the maximum value of dimensionless figure of merit ZT to be obtained from the known thermoelectric material is at most 1.0 which can be obtained from the conventional Bi—Te-based materials. Whereas in this example, it was possible, due to the specific composition of $(Ti_{0.3}Zr_{0.35}Hf_{0.35})CoSb$, to obtain a thermoelectric material having a high-performance exceeding over this conventional maximum value.

COMPARATIVE EXAMPLE 1

99.9% pure Zr, 99.9% pure Hf, 99.99% pure Co and 99.99% pure Sb were prepared as raw materials, which were then weighed respectively to meet a composition formula of $Zr_{0.5}Hf_{0.5}CoSb$. By using the raw powder weighed in this manner, a sintered body was manufactured by the same procedures as explained in Example 1 and the resultant sintered body was evaluated with respect to the thermoelectric characteristics thereof. The values of the electric resistivity, the Seebeck coefficient, the lattice thermal conductivity and the dimensionless figure of merit ZT all obtained at temperatures of 300K and 700K were as follows.

300K: Electric resistivity=$10.6 \times 10^{-3}$ Ωcm;
Seebeck coefficient=$-189$ μV/K;
Lattice thermal conductivity=4.38 W/mK;
ZT=0.02
700K: Electric resistivity=$2.55 \times 10^{-3}$ Ωcm;
Seebeck coefficient=$-250$ μV/K;
Lattice thermal conductivity=3.5 W/mK;
ZT=0.41

The temperature dependency of dimensionless figure of merit ZT of the thermoelectric material manufactured in this Comparative Example 1 is shown as a curve "6" in FIG. 6. It will be seen from FIG. 6 that the dimensionless figure of merit ZT of this thermoelectric material was about 0.42 at maximum.

As apparent from this result, it was impossible, due to the composition of $Zr_{0.5}Hf_{0.5}CoSb$, to obtain a high-performance thermoelectric material which is capable of exceeding over that of Bi—Te-based material exhibiting a ZT value of 1.0.

EXAMPLES 2 TO 18; COMPARATIVE EXAMPLES 2 TO 3

Thermoelectric materials each varying in composition and represented by a formula of $(Ti_{a1}Zr_{b1}Hf_{c1})CoSb$ were manufactured according to the same procedures as explained in the aforementioned Example 1. Further, each of these thermoelectric materials was evaluated on the characteristics thereof at temperatures of 300K and 700K in the same manner as described above, the results obtained being summarized in the following Table 1. Incidentally, Table 1 also shows the results obtained in the aforementioned (Example 1) and (Comparative Example 1).

As shown in Table 1, the thermoelectric materials of various compositions each containing three elements (i.e. Ti, Zr and Hf) and represented by the aforementioned formula (1) were all recognized as having excellent thermoelectric conversion characteristics. Whereas, Comparative Examples 1, 2 and 3 all failing to include one of the elements Ti, Zr and Hf were found low in value of the dimensionless figure of merit ZT as apparent from the results of Table 1.

EXAMPLES 19 TO 33

Part of Ti, Zr and Hf in the thermoelectric material represented by a formula of $(Ti_{0.3}Zr_{0.35}Hf_{0.35})CoSb$ which was prepared in the aforementioned Example 1 was replaced with at least one element selected from the group consisting of V, Nb and Ta, thereby manufacturing various thermoelectric materials represented by a formula of $((Ti_{0.3}Zr_{0.35}Hf_{0.35})_{1-e}X_e)CoSb$.

More specifically, these thermoelectric materials were manufactured by the same procedures as explained in the aforementioned Example 1 except that V, Nb or Ta constituting X was additionally incorporated as a substituting element at a ratio of "e" as shown in the following Table 2. Then, each of these thermoelectric materials was evaluated on the characteristics thereof at temperatures of 300K and 700K in the same manner as described above, the results obtained being summarized in the following Table 2.

TABLE 1

|  | Ti ratio a1 | Zr ratio b1 | Hf ratio c1 | 300 K Lattice thermal conductivity | 300 K Dimensionless figure of merit ZT | 700 K Lattice thermal conductivity | 700 K Dimensionless figure of merit ZT |
| --- | --- | --- | --- | --- | --- | --- | --- |
| Comp. Ex. 1 | 0.0 | 0.5 | 0.5 | 3.95 | 0.02 | 3.49 | 0.53 |
| Comp. Ex. 2 | 0.5 | 0.0 | 0.5 | 4.11 | 0.02 | 3.61 | 0.48 |
| Comp. Ex. 3 | 0.5 | 0.5 | 0.0 | 4.65 | 0.01 | 4.05 | 0.35 |
| Ex. 2 | 0.01 | 0.01 | 0.98 | 3.66 | 0.06 | 2.50 | 1.01 |
| Ex. 3 | 0.01 | 0.98 | 0.01 | 3.7 | 0.05 | 2.51 | 1.00 |
| Ex. 4 | 0.98 | 0.01 | 0.01 | 3.71 | 0.05 | 2.55 | 1.00 |
| Ex. 5 | 0.02 | 0.49 | 0.49 | 3.61 | 0.07 | 2.40 | 1.05 |
| Ex. 6 | 0.49 | 0.02 | 0.49 | 3.79 | 0.07 | 2.45 | 1.03 |
| Ex. 7 | 0.49 | 0.49 | 0.02 | 3.80 | 0.06 | 2.47 | 1.02 |
| Ex. 8 | 0.1 | 0.1 | 0.8 | 3.55 | 0.08 | 2.10 | 1.10 |
| Ex. 9 | 0.1 | 0.8 | 0.1 | 3.50 | 0.08 | 2.16 | 1.08 |
| Ex. 10 | 0.8 | 0.1 | 0.1 | 3.58 | 0.09 | 2.20 | 1.07 |
| Ex. 1 | 0.3 | 0.35 | 0.35 | 3.05 | 0.12 | 1.95 | 1.20 |
| Ex. 11 | 0.35 | 0.3 | 0.35 | 2.95 | 0.13 | 1.90 | 1.17 |
| Ex. 12 | 0.35 | 0.35 | 0.3 | 3.00 | 0.12 | 1.95 | 1.20 |
| Ex. 13 | 0.1 | 0.45 | 0.45 | 3.67 | 0.08 | 2.25 | 1.09 |
| Ex. 14 | 0.45 | 0.1 | 0.45 | 3.45 | 0.07 | 2.08 | 1.07 |
| Ex. 15 | 0.45 | 0.45 | 0.1 | 3.55 | 0.07 | 2.15 | 1.10 |
| Ex. 16 | 0.2 | 0.4 | 0.4 | 3.36 | 0.10 | 2.10 | 1.16 |
| Ex. 17 | 0.4 | 0.2 | 0.4 | 3.20 | 0.09 | 1.99 | 1.13 |
| Ex. 18 | 0.4 | 0.4 | 0.2 | 3.28 | 0.10 | 2.05 | 1.11 |

TABLE 2

|  | Substituent element species X | Ratio of substituent element e | 300 K | | 700 K | |
|---|---|---|---|---|---|---|
|  |  |  | Lattice thermal conductivity | Dimensionless figure of merit ZT | Lattice thermal conductivity | Dimensionless figure of merit ZT |
| Ex. 19 | V | 0.003 | 3.21 | 0.24 | 1.93 | 1.19 |
| Ex. 20 | V | 0.01 | 3.10 | 0.27 | 1.84 | 1.27 |
| Ex. 21 | V | 0.03 | 3.04 | 0.24 | 1.81 | 1.20 |
| Ex. 22 | V | 0.10 | 2.95 | 0.22 | 1.77 | 1.08 |
| Ex. 23 | V | 0.30 | 2.90 | 0.20 | 1.74 | 1.03 |
| Ex. 24 | Nb | 0.003 | 3.08 | 0.26 | 1.85 | 1.24 |
| Ex. 25 | Nb | 0.01 | 3.05 | 0.28 | 1.81 | 1.29 |
| Ex. 26 | Nb | 0.03 | 3.01 | 0.27 | 1.77 | 1.22 |
| Ex. 27 | Nb | 0.10 | 2.95 | 0.25 | 1.70 | 1.10 |
| Ex. 28 | Nb | 0.30 | 2.92 | 0.23 | 1.67 | 1.05 |
| Ex. 29 | Ta | 0.003 | 3.00 | 0.27 | 1.83 | 1.26 |
| Ex. 30 | Ta | 0.01 | 2.94 | 0.28 | 1.79 | 1.30 |
| Ex. 31 | Ta | 0.03 | 2.90 | 0.28 | 1.74 | 1.28 |
| Ex. 32 | Ta | 0.10 | 2.85 | 0.24 | 1.69 | 1.23 |
| Ex. 33 | Ta | 0.30 | 2.81 | 0.21 | 1.64 | 1.18 |

As shown in Table 2, the thermoelectric materials of various compositions each represented by a formula of $((Ti_{0.3}Zr_{0.35}Hf_{0.35})_{1-e}X_e)CoSb$ (X=V, Nb or Ta) were all recognized as having excellent thermoelectric conversion characteristics.

Furthermore, part of Ti, Zr and Hf in the thermoelectric materials manufactured in Examples 2 to 18 was replaced with at least one selected from the group consisting of V, Nb and Ta, thereby manufacturing various thermoelectric materials all also having excellent thermoelectric conversion characteristics.

Additionally, part of Ti, Zr and Hf in the thermoelectric materials manufactured in Examples 1 to 18 was replaced with at least one selected from the group consisting of Cr, Mo and W, thereby manufacturing various thermoelectric materials all also having excellent thermoelectric conversion characteristics.

EXAMPLES 34~38

Part of Co in the thermoelectric material represented by a formula of $(Ti_{0.3}Zr_{0.35}Hf_{0.35})CoSb$ which was prepared in the aforementioned Example 1 was replaced with Ni, thereby manufacturing various thermoelectric materials represented by a formula of $(Ti_{0.3}Zr_{0.35}Hf_{0.35})Co_{1-f}Ni_fSb$.

More specifically, these thermoelectric materials were manufactured by the same procedures as explained in the aforementioned Example 1 except that Ni was additionally incorporated as a substituting element at a ratio of "f" as shown in the following Table 3. Then, each of these thermoelectric materials was evaluated on the characteristics thereof at temperatures of 300K and 700K in the same manner as described above, the results obtained being summarized in the following Table 3.

TABLE 3

|  | Ratio of substituent element f | 300 K | | 700 K | |
|---|---|---|---|---|---|
|  |  | Lattice thermal conductivity | Dimensionless figure of merit ZT | Lattice thermal conductivity | Dimensionless figure of merit ZT |
| Ex. 34 | 0.003 | 3.15 | 0.26 | 1.89 | 1.21 |
| Ex. 35 | 0.01 | 3.08 | 0.29 | 1.83 | 1.28 |

TABLE 3-continued

|  | Ratio of substituent element f | 300 K | | 700 K | |
|---|---|---|---|---|---|
|  |  | Lattice thermal conductivity | Dimensionless figure of merit ZT | Lattice thermal conductivity | Dimensionless figure of merit ZT |
| Ex. 36 | 0.03 | 3.01 | 0.26 | 1.79 | 1.22 |
| Ex. 37 | 0.10 | 2.96 | 0.24 | 1.73 | 1.17 |
| Ex. 38 | 0.30 | 2.90 | 0.20 | 1.66 | 1.10 |

As shown in Table 3, the thermoelectric materials of various compositions each represented by a formula of $(Ti_{0.3}Zr_{0.35}Hf_{0.35})Co_{1-f}Ni_fSb$ were all recognized as having excellent thermoelectric conversion characteristics.

Furthermore, part of Co in the thermoelectric materials manufactured in Examples 1 to 18 was replaced with at least one element selected from the group consisting of Ni, Pd and Pt, thereby manufacturing various thermoelectric materials all also having excellent thermoelectric conversion characteristics.

EXAMPLES 39~48

Part of Sb in the thermoelectric material represented by a formula of $(Ti_{0.3}Zr_{0.35}Hf_{0.35})CoSb$ which was prepared in the aforementioned Example 1 was replaced with at least one element selected from the group consisting of Se and Te, thereby manufacturing various thermoelectric materials represented by a formula of $(T_{0.3}Zr_{0.35}Hf_{0.35})CoSb_{1-g}X_g$.

More specifically, these thermoelectric materials were manufactured by the same procedures as explained in the aforementioned Example 1 except that Se or Te constituting X was additionally incorporated as a substituting element at a ratio of "g" as shown in the following Table 4. Then, each of these thermoelectric materials was evaluated on the characteristics thereof at temperatures of 300K and 700K in the same manner as described above, the results obtained being summarized in the following Table 4.

TABLE 4

| | Substituent element species X | Ratio of substituent element g | 300 K | | 700 K | |
|---|---|---|---|---|---|---|
| | | | Lattice thermal conductivity | Dimensionless figure of merit ZT | Lattice thermal conductivity | Dimensionless figure of merit ZT |
| Ex. 39 | Sb | 0.003 | 3.07 | 0.29 | 1.95 | 1.07 |
| Ex. 40 | Sb | 0.01 | 3.01 | 0.32 | 1.89 | 1.19 |
| Ex. 41 | Sb | 0.03 | 2.95 | 0.28 | 1.83 | 1.14 |
| Ex. 42 | Sb | 0.10 | 2.91 | 0.25 | 1.77 | 1.08 |
| Ex. 43 | Sb | 0.30 | 2.85 | 0.21 | 1.71 | 1.02 |
| Ex. 44 | Bi | 0.003 | 2.97 | 0.29 | 1.81 | 1.04 |
| Ex. 45 | Bi | 0.01 | 2.90 | 0.33 | 1.72 | 1.15 |
| Ex. 46 | Bi | 0.03 | 2.83 | 0.29 | 1.67 | 1.11 |
| Ex. 47 | Bi | 0.10 | 2.77 | 0.26 | 1.61 | 1.04 |
| Ex. 48 | Bi | 0.30 | 2.71 | 0.21 | 1.55 | 1.00 |

As shown in Table 4, the thermoelectric materials of various compositions each represented by a formula of $(Ti_{0.3}Zr_{0.35}Hf_{0.35})CoS_{1-g}X_g$ (X=Se or Te) were all recognized as having excellent thermoelectric conversion characteristics.

Furthermore, part of Sb in the thermoelectric materials manufactured in Examples 2 to 18 was replaced with at least one element selected from the group consisting of Se and Te, thereby manufacturing various thermoelectric materials all also having excellent thermoelectric conversion characteristics.

EXAMPLES 49 TO 63

Part of Ti, Zr and Hf in the thermoelectric material represented by a formula of $(Ti_{0.3}Zr_{0.35}Hf_{0.35})CoSb$ which was prepared in the aforementioned Example 1 was replaced with at least one element selected from the group consisting of Y, Dy and Er, thereby manufacturing various thermoelectric materials represented by a formula of $((Ti_{0.3}Zr_{0.35}Hf_{0.35})_{1-h}X_h)CoSb$.

More specifically, these thermoelectric materials were manufactured by the same procedures as explained in the aforementioned Example 1 except that Y, Dy and Er constituting X was additionally incorporated as a substituting element at a ratio of "h" as shown in the following Table 5. Then, each of these thermoelectric materials was evaluated on the characteristics thereof at temperatures of 300K and 700K in the same manner as described above, the results obtained being summarized in the following Table 5.

TABLE 5

| | Substituent element species X | Ratio of substituent element h | 300 K | | 700 K | |
|---|---|---|---|---|---|---|
| | | | Lattice thermal conductivity | Dimensionless figure of merit ZT | Lattice thermal conductivity | Dimensionless figure of merit ZT |
| Ex. 49 | Y | 0.003 | 3.21 | 0.24 | 1.93 | 1.19 |
| Ex. 50 | Y | 0.01 | 3.10 | 0.27 | 1.84 | 1.27 |
| Ex. 51 | Y | 0.03 | 3.04 | 0.24 | 1.81 | 1.20 |
| Ex. 52 | Y | 0.10 | 2.95 | 0.22 | 1.77 | 1.08 |
| Ex. 53 | Y | 0.30 | 2.90 | 0.18 | 1.72 | 1.02 |
| Ex. 54 | Dy | 0.003 | 3.08 | 0.26 | 1.85 | 1.24 |
| Ex. 55 | Dy | 0.01 | 3.05 | 0.28 | 1.81 | 1.29 |
| Ex. 56 | Dy | 0.03 | 3.01 | 0.27 | 1.77 | 1.22 |
| Ex. 57 | Dy | 0.10 | 2.95 | 0.25 | 1.70 | 1.10 |
| Ex. 58 | Dy | 0.30 | 2.89 | 0.20 | 1.64 | 1.06 |
| Ex. 59 | Er | 0.003 | 3.00 | 0.27 | 1.83 | 1.26 |
| Ex. 60 | Er | 0.01 | 2.94 | 0.28 | 1.79 | 1.30 |
| Ex. 61 | Er | 0.03 | 2.90 | 0.28 | 1.74 | 1.28 |
| Ex. 62 | Er | 0.10 | 2.85 | 0.24 | 1.69 | 1.23 |
| Ex. 63 | Er | 0.30 | 2.79 | 0.21 | 1.65 | 1.17 |

As shown in Table 5, the thermoelectric materials of various compositions each represented by a formula of $((Ti0.3Zr_{0.35}Hf_{0.35})_{1-h}X_h)CoSb$ ($X_{0.35}$=Y, Dy and Er) were all recognized as having excellent thermoelectric conversion characteristics.

Additionally, part of Ti, Zr and Hf in the thermoelectric materials manufactured in Examples 2 to 18 was replaced with at least one selected from the group consisting of Y, Dy and Er, thereby manufacturing various thermoelectric materials all also having excellent thermoelectric conversion characteristics.

Furthermore, part of Ti, Zr and Hf in the thermoelectric materials manufactured in Examples 1 to 18 was replaced with at least one selected from the group consisting of lanthanoids (other than Sc, Dy and Er), Th and U, thereby manufacturing various thermoelectric materials all also having excellent thermoelectric conversion characteristics.

EXAMPLES 64 TO 68

Part of Co in the thermoelectric material represented by a formula of $(Ti_{0.3}Zr_{0.35}Hf_{0.35})CoSb$ which was prepared in the aforementioned Example 1 was replaced with Fe, thereby manufacturing various thermoelectric materials represented by a formula of $(Ti_{0.3}Zr_{0.35}Hf_{0.35})Co_{1-i}Fe_iSb$.

More specifically, these thermoelectric materials were manufactured by the same procedures as explained in the aforementioned Example 1 except that Fe was additionally incorporated as a substituting element at a ratio of "i" as shown in the following Table 6. Then, each of these thermoelectric materials was evaluated on the characteristics thereof at temperatures of 300K and 700K in the same manner as described above, the results obtained being summarized in the following Table 6.

TABLE 6

|  | 300 K | | 700 K | |
|---|---|---|---|---|
| Ratio of substituent element I | Lattice thermal conductivity | Dimensionless figure of merit ZT | Lattice thermal conductivity | Dimensionless figure of merit ZT |
| Ex. 64 | 0.003 | 3.15 | 0.26 | 1.89 | 1.21 |
| Ex. 65 | 0.01 | 3.08 | 0.29 | 1.83 | 1.28 |
| Ex. 66 | 0.03 | 3.01 | 0.26 | 1.79 | 1.22 |
| Ex. 67 | 0.10 | 2.96 | 0.24 | 1.73 | 1.17 |
| Ex. 68 | 0.10 | 2.92 | 0.21 | 1.66 | 1.12 |

As shown in Table 6, the thermoelectric materials of various compositions each represented by a formula of $(Ti_{0.3}Zr_{0.35}Hf_{0.35})Co_{1-i}Fe_iSb$ were all recognized as having excellent thermoelectric conversion characteristics.

Furthermore, part of Co in the thermoelectric materials manufactured in Examples 1 to 18 was replaced with at least one element selected from the group consisting of Fe, Ru and Os, thereby manufacturing various thermoelectric materials all also having excellent thermoelectric conversion characteristics.

EXAMPLES 69 TO 77

Part of Sb in the thermoelectric material represented by a formula of $(Ti_{0.3}Zr_{0.35}Hf_{0.35})CoSb$ which was prepared in the aforementioned Example 1 was replaced with at least one element selected from the group consisting of Ge and Sn, thereby manufacturing various thermoelectric materials represented by a formula of $(Ti_{0.3}Zr_{0.35}Hf_{0.35})CoSb_{1-j}X_j$.

More specifically, these thermoelectric materials were manufactured by the same procedures as explained in the aforementioned Example 1 except that Se or Te constituting X was additionally incorporated as a substituting element at a ratio of "j" as shown in the following Table 7. Then, each of these thermoelectric materials was evaluated on the characteristics thereof at temperatures of 300K and 700K in the same manner as described above, the results obtained being summarized in the following Table 7.

TABLE 7

|  |  |  | 300 K | | 700 K | |
|---|---|---|---|---|---|---|
|  | Substituent element species X | Ratio of substituent element j | Lattice thermal conductivity | Dimensionless figure of merit ZT | Lattice thermal conductivity | Dimensionless figure of merit ZT |
| Ex. 69 | Ge | 0.003 | 3.07 | 0.29 | 1.95 | 1.07 |
| Ex. 70 | Ge | 0.01 | 3.01 | 0.32 | 1.89 | 1.19 |
| Ex. 71 | Ge | 0.03 | 2.95 | 0.28 | 1.83 | 1.14 |
| Ex. 72 | Ge | 0.10 | 2.91 | 0.25 | 1.77 | 1.08 |
| Ex. 72 | Ge | 0.30 | 2.84 | 0.20 | 1.72 | 1.02 |
| Ex. 73 | Sn | 0.003 | 2.97 | 0.29 | 1.81 | 1.04 |
| Ex. 74 | Sn | 0.01 | 2.90 | 0.33 | 1.72 | 1.15 |
| Ex. 75 | Sn | 0.03 | 2.83 | 0.29 | 1.67 | 1.11 |
| Ex. 76 | Sn | 0.10 | 2.77 | 0.26 | 1.61 | 1.04 |
| Ex. 77 | Sn | 0.30 | 2.73 | 0.20 | 1.57 | 1.01 |

As shown in Table 7, the thermoelectric materials of various compositions each represented by a formula of $(Ti_{0.3}Zr_{0.35}Hf_{0.35})CoSb_{1-j}X_j$ (X=Ge or Sn) were all recognized as having excellent thermoelectric conversion characteristics.

Furthermore, part of Sb in the thermoelectric materials manufactured in Examples 2 to 18 was replaced with at least one element selected from the group consisting of Se and Te, thereby manufacturing various thermoelectric materials all also having excellent thermoelectric conversion characteristics.

EXAMPLE 78

By using a composition consisting of $(Y_{0.5}Er_{0.5})Ni_{0.99}Co_{0.01}$ as a p-type thermoelectric material and the thermoelectric material of Example 27 as an n-type thermoelectric material, a thermoelectric module as shown in FIG. 3 was manufactured.

Each of these p-type and n-type thermoelectric materials was cut into a body 3.0 mm×3.0 mm square in planar configuration and 10.0 mm in height. 60 pieces of p-type thermoelectric bodies and 60 pieces of n-type thermoelectric bodies were alternately arranged in the form of matrix consisting of 10 columns×12 rows. Then, all of 120 pieces were electrically connected in series with a silver electrode board. To the other surface of the silver electrode board, i.e. the surface opposite to the surface to which the thermoelectric module was connected, there was attached an aluminum nitride sintered plate, and furthermore, lead wires were connected to the terminal electrodes, thereby manufacturing the thermoelectric module.

Then, to this thermoelectric module, the power-generating property thereof was evaluated by setting the temperature of upper temperature side to 570° C. and the temperature of lower temperature side to 55° C. The internal resistance of this thermoelectric module was found 2.22 Ω under these temperature conditions. The power-generating property of this thermoelectric module was measured under a matched load condition where the load connected thereto was set to 2.22 Ω which was the same as that of the internal resistance of thermoelectric module. As a result, the voltage generated was 5.0 V, and an electric current of 3.24 A was permitted to flow, thereby obtaining an electric power of 16.2 W, thus confirming the generation of electric power.

As described above, it is possible according to the embodiment of the present invention to provide a thermoelectric material having a large dimensionless figure of merit ZT and to provide a thermoelectric module where such a thermoelectric material is employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric material comprising a main phase which is a sintered body and represented by the following composition formula and having an MgAgAs-type crystalline structure:

$$(Ti_{a1}Zr_{b1}Hf_{c1})_x Co_y Sb_{100-x-y}$$

wherein $0<a1<1, 0<b1<1, 0<c1<1, a1+b1+c1=1, 30\leq x \leq 35$, and $30 \leq y \leq 35$, and 0.3-30 atom. % of Sb is replaced by at least one selected from the group consisting of Se, Te, Ge and Sn.

2. The thermoelectric material according to claim 1, wherein the sintered body has a dimensionless figure of merit ZT value of 0.20 to 0.33 at 300K when 0.3-30 atom. % of Sb is replaced by at least one selected from the group consisting of Ge and Sn.

3. The thermoelectric material according to claim 1, wherein Sb is replaced by Sn.

4. The thermoelectric material according to claim 1, wherein a1 in the composition formula is confined within the range of $0.2<a1<0.8$.

5. The thermoelectric material according to claim 1, wherein b1 in the composition formula is confined within the range of $0.2<b1<0.8$.

6. The thermoelectric material according to claim 1, wherein c1 in the composition formula is confined within the range of $0.2<c1<0.8$.

7. The thermoelectric material according to claim 1, wherein x in the composition formula is confined within the range of $33 \leq x \leq 34$.

8. The thermoelectric material according to claim 1, wherein y in the composition formula is confined within the range of $33 \leq y \leq 34$.

9. The thermoelectric material according to claim 1, wherein Ti, Zr and Hf in the composition formula are partially replaced by at least one selected from the group consisting of V, Nb, Ta, Cr, Mo, W, Sc, Y, Th, U and lanthanoids.

10. The thermoelectric material according to claim 9, wherein Ti, Zr and Hf are partially replaced at a ratio of not more than 30 atom. % of the total quantity of Ti, Zr and Hf.

11. The thermoelectric material according to claim 1, wherein Co in the composition formula is partially replaced by at least one selected from the group consisting of Ni, Pd, Pt, Fe, Ru and Os.

12. The thermoelectric material according to claim 11, wherein Co is partially replaced at a ratio of not more than 30 atom. % of Co.

13. A thermoelectric module comprising p-type elements comprising a p-type thermoelectric material and n-type elements comprising an n-type thermoelectric material, these p-type and n-type elements being alternately connected with each other in series, and the p-type thermoelectric material comprising the thermoelectric material according to claim 1.

14. The thermoelectric module according to claim 13, wherein the sintered body has a dimensionless figure of merit ZT value of 0.20 to 0.33 at 300K when 0.3-30 atom. % of Sb is replaced by at least one selected from the group consisting of Ge and Sn.

15. The thermoelectric material according to claim 13, wherein Sb is replaced by Sn.

16. The thermoelectric module according to claim 13, wherein at least one of a1, b1 and c1 in the composition formula are confined to more than 0.2 and less than 0.8.

17. The thermoelectric module according to claim 13, wherein at least one of x and y in the composition formula are confined to 33 or more and 34 or less.

18. The thermoelectric module according to claim 13, wherein said thermoelectric module is a thermal battery.

19. The thermoelectric module according to claim 13, wherein said thermoelectric module is a cooler.

* * * * *